United States Patent
Hong et al.

(10) Patent No.: US 9,788,429 B2
(45) Date of Patent: Oct. 10, 2017

(54) DISPLAY DEVICE INCLUDING TOUCH SENSING LAYER AND DRIVER INTEGRATED CIRCUIT ELECTRICALLY CONNECTED TO TOUCH SENSING LAYER

(71) Applicant: Samsung Display Co., Ltd., Yongin (KR)

(72) Inventors: Jun Woo Hong, Cheonan-si (KR); Hae Kwan Seo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 95 days.

(21) Appl. No.: 14/737,165

(22) Filed: Jun. 11, 2015

(65) Prior Publication Data
US 2016/0128194 A1    May 5, 2016

(30) Foreign Application Priority Data

Oct. 29, 2014   (KR) .................. 10-2014-0148328

(51) Int. Cl.
*H05K 1/00*    (2006.01)
*H05K 1/14*    (2006.01)
(Continued)

(52) U.S. Cl.
CPC ............. *H05K 1/147* (2013.01); *G06F 3/041* (2013.01); *H05K 1/189* (2013.01);
(Continued)

(58) Field of Classification Search
CPC .......... G06F 3/041; G06F 2203/04103; H05K 1/189; H05K 2201/10128;
(Continued)

(56) References Cited

U.S. PATENT DOCUMENTS 6,597,113 B1 * 7/2003 Nitta ..................... H01J 11/12
  313/48
8,624,876 B2   1/2014 Yu et al.
(Continued)

FOREIGN PATENT DOCUMENTS

KR    10-1074414    10/2011
KR    1020130116425    10/2013
(Continued)

*Primary Examiner* — James Wu
(74) *Attorney, Agent, or Firm* — H.C. Park & Associates, PLC

(57) ABSTRACT

A display device includes a panel substrate, a first printed circuit board (PCB), a driver integrated circuit (IC), and a second PCB. The panel substrate includes a first substrate and a second substrate. The first PCB is disposed on the second substrate. The driver IC is disposed on the first substrate and is electrically connected to the first PCB. The second PCB is disposed on the first substrate and is electrically connected to the driver IC. The driver IC includes a first pad and a second pad. The first pad is disposed on an upper or lateral surface of the driver IC, the first pad being configured to transmit signals received via the first PCB. The second pad is disposed on a lower surface of the driver IC, the second pad being configured to receive the signals from the first PCB and to transmit the signals to the second PCB.

8 Claims, 9 Drawing Sheets

(51) Int. Cl.
  *H05K 1/18* (2006.01)
  *G06F 3/041* (2006.01)
(52) U.S. Cl.
  CPC .............. *G06F 2203/04103* (2013.01); *H05K 2201/09781* (2013.01); *H05K 2201/10128* (2013.01)
(58) Field of Classification Search
  CPC ......... H05K 2201/09781; H05K 3/361; H05K 1/147; H05K 1/113; H01L 2225/06541; H01L 23/481; G02F 1/13452; G09G 2300/0408
  USPC ........................................................ 361/749
  See application file for complete search history.

(56) References Cited

U.S. PATENT DOCUMENTS

| | | | | |
|---|---|---|---|---|
| 2007/0075413 A1* | 4/2007 | Egawa | ................ | H01L 21/6835 257/686 |
| 2012/0098774 A1* | 4/2012 | Abe | .................. | G02F 1/133308 345/173 |
| 2013/0241873 A1 | 9/2013 | Kim et al. | | |
| 2014/0098055 A1 | 4/2014 | Choi et al. | | |

FOREIGN PATENT DOCUMENTS

| KR | 10-1352117 | 1/2014 |
|---|---|---|
| KR | 10-2014-0045151 | 4/2014 |

* cited by examiner

DISPLAY DEVICE INCLUDING TOUCH SENSING LAYER AND DRIVER INTEGRATED CIRCUIT ELECTRICALLY CONNECTED TO TOUCH SENSING LAYER

CROSS-REFERENCE TO RELATED APPLICATION

This application claims priority from and the benefit of Korean Patent Application No. 10-2014-0148328, filed on Oct. 29, 2014, which is incorporated herein by reference for all purposes as if set forth herein.

BACKGROUND

Field

Exemplary embodiments relate to display technology, and, more particularly, to a display device including a touch sensing layer.

Discussion

The development of an information consuming society has spawned utilization of display devices, which include touch sensing layers configured to detect and process user commands. For instance, a user may select executable content displayed via a screen of the display device by touching (or hovering over) a portion of the touch sensing layers disposed in association with the executable content. In this manner, users may interact with the touch sensing layers via one or more appendages, e.g., fingers, etc., or an object, such as a stylus.

A display device provided with a built-in touch sensing layer may be referred to as an On Cell Touch Active-Matrix Organic Light-Emitting Diode (AMOLED) (OCTA) type display device. Display devices of the OCTA type, may include a driver integrated circuit (hereinafter referred to as a "driver IC") configured to drive light emitting elements arranged on a first substrate, as well as include a touch flexible printed circuit board connected to a touch driver integrated circuit (hereinafter referred to as a "touch driver IC") to drive a touch sensing layer arranged on a second substrate. The main flexible printed circuit board may be configured to apply control signals input from an outside to the driver IC that is disposed on the first substrate and may be arranged at a lower end of the driver IC. The touch driver IC may be disposed on the main flexible printed circuit board. The touch flexible printed circuit board may contact the main flexible printed circuit board in order to connect to the touch driver IC. In this manner, the touch flexible printed circuit board and the main flexible printed circuit board are typically spaced apart by a determined distance to avoid interference with one another.

It is noted that because the touch flexible printed circuit board is connected to the main flexible printed circuit board, the touch flexible printed circuit board may be lengthened to that extent, and, as such, fabricating costs may be increased. Further, to avoid (or at least reduce) interference between the main flexible printed circuit board and the touch flexible printed circuit board, changes in the position of any one of the main flexible printed circuit board and the touch flexible printed circuit board may be necessary. As such, constraints (e.g., mechanical, electrical, etc.) may be imposed, which may result in design restriction(s).

The above information disclosed in this Background section is only for enhancement of understanding of the background of the inventive concept, and, therefore, it may contain information that does not form the prior art that is already known in this country to a person of ordinary skill in the art.

SUMMARY

One or more exemplary embodiments seek to provide a display device configured to reduce signal interference between a touch flexible printed circuit board and a main flexible printed circuit board by connecting the touch flexible printed circuit board to a driver IC or via wires of a first substrate. In this manner, a higher degree of design freedom may be realized in association with the display device. This too may reduce fabricating cost.

Additional aspects will be set forth in the detailed description which follows, and, in part, will be apparent from the disclosure, or may be learned by practice of the inventive concept.

According to one or more exemplary embodiments, a display device includes a panel substrate, a first printed circuit board (PCB), a driver integrated circuit (IC), and a second PCB. The panel substrate includes a first substrate and a second substrate. The first PCB is disposed on the second substrate. The driver IC is disposed on the first substrate and is electrically connected to the first PCB. The second PCB is disposed on the first substrate and is electrically connected to the driver IC. The driver IC includes a first pad and a second pad. The first pad is disposed on an upper or lateral surface of the driver IC, the first pad being configured to transmit signals received via the first PCB. The second pad is disposed on a lower surface of the driver IC, the second pad being configured to receive the signals from the first PCB and to transmit the signals to the second PCB.

According to one or more exemplary embodiments, a display device includes a first substrate, a second substrate, a first printed circuit board, a driver integrated circuit (IC), and a second printed circuit board. The first substrate includes a pixel unit. The pixel unit includes a plurality of pixels. The second substrate is disposed on the first substrate. The first printed circuit board is disposed on the second substrate. The driver IC is disposed on the first substrate. The second printed circuit board is disposed on the first substrate and is configured to transfer data signals and timing signals received from the driver IC. A first wire area is disposed on the first substrate, the first wire area electrically connecting the pixel unit to the driver IC. A second wire area is disposed on the first substrate, the second wire area electrically connecting the driver IC to the second printed circuit board. The first printed circuit board is electrically connected to at least one wire of at least one of the first wire area and the second wire area.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
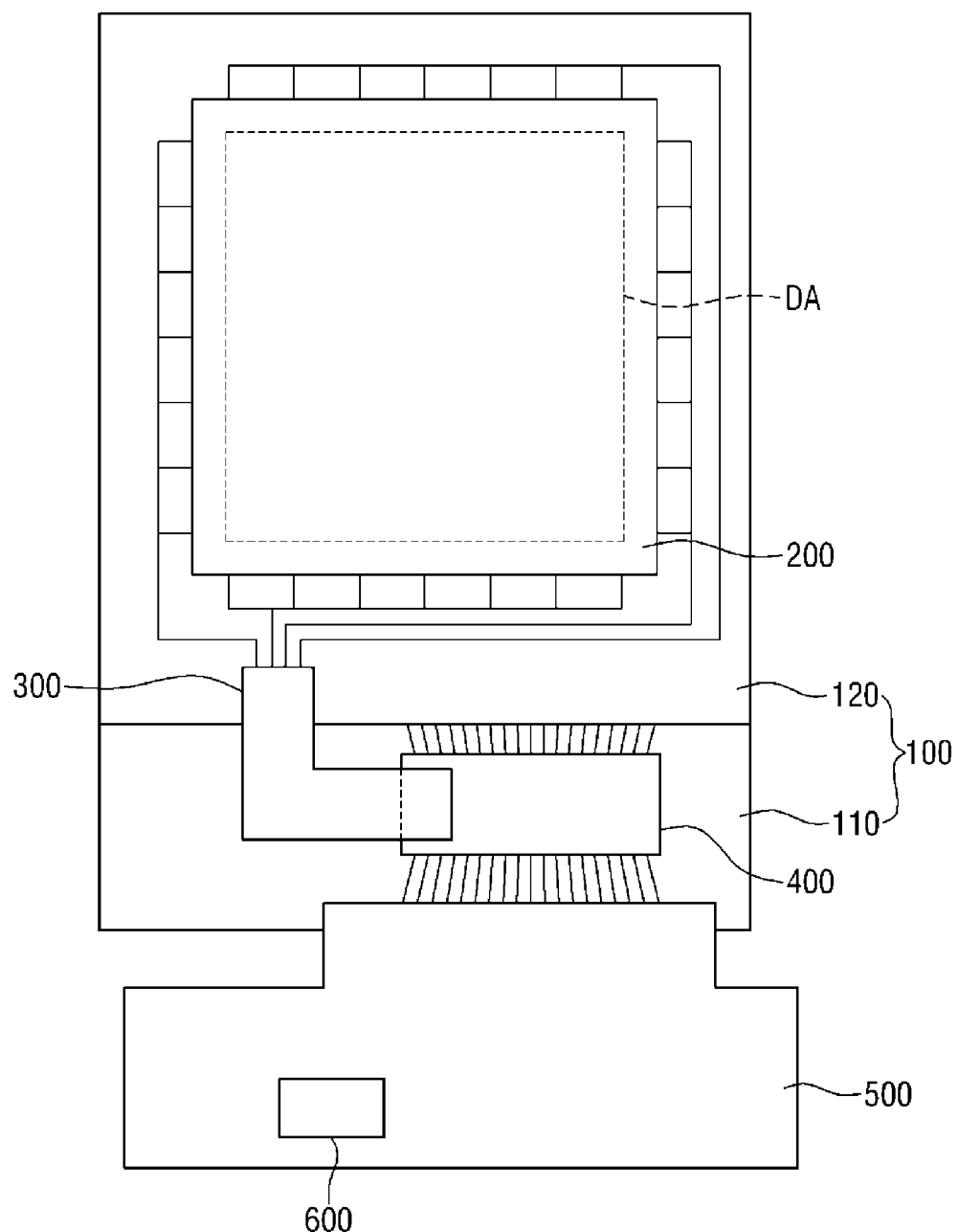
FIG. 1 is a plan view schematically illustrating a display device, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
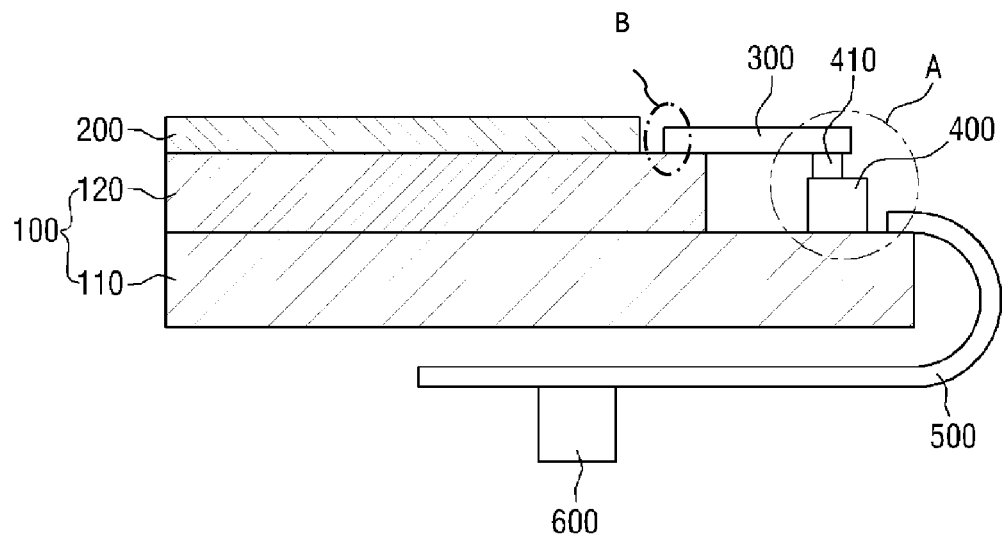
FIG. 2 is a cross-sectional view schematically illustrating the display device of FIG. 1, according one or more exemplary embodiments.
Figure 3A:
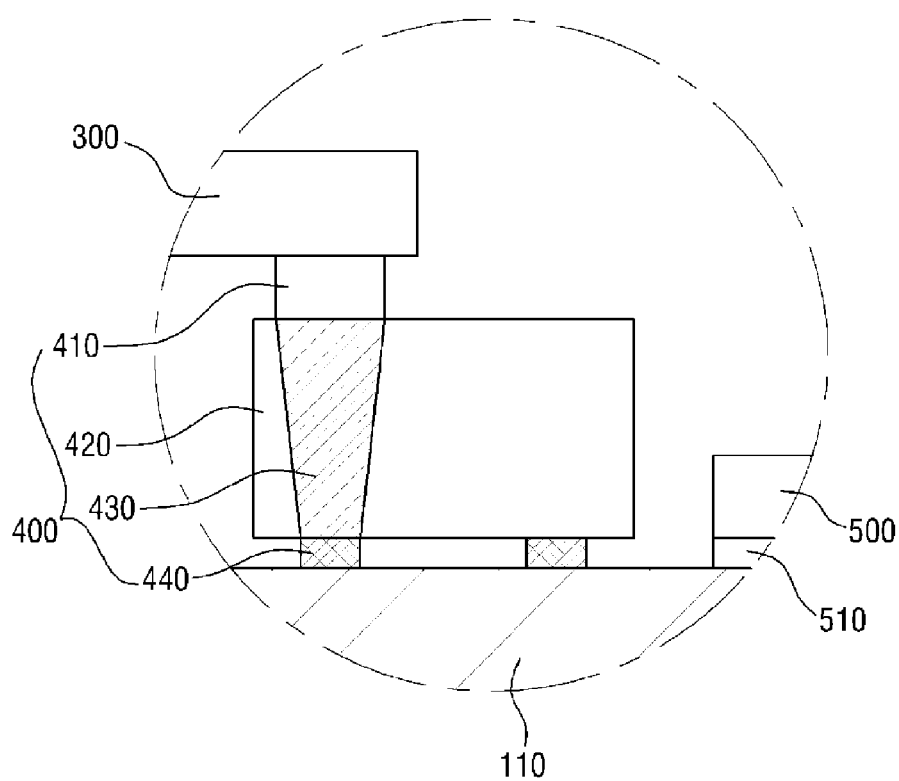
FIG. 3A is an enlarged view of portion A of FIG. 2, according to one or more exemplary embodiments.
Figure 3B:
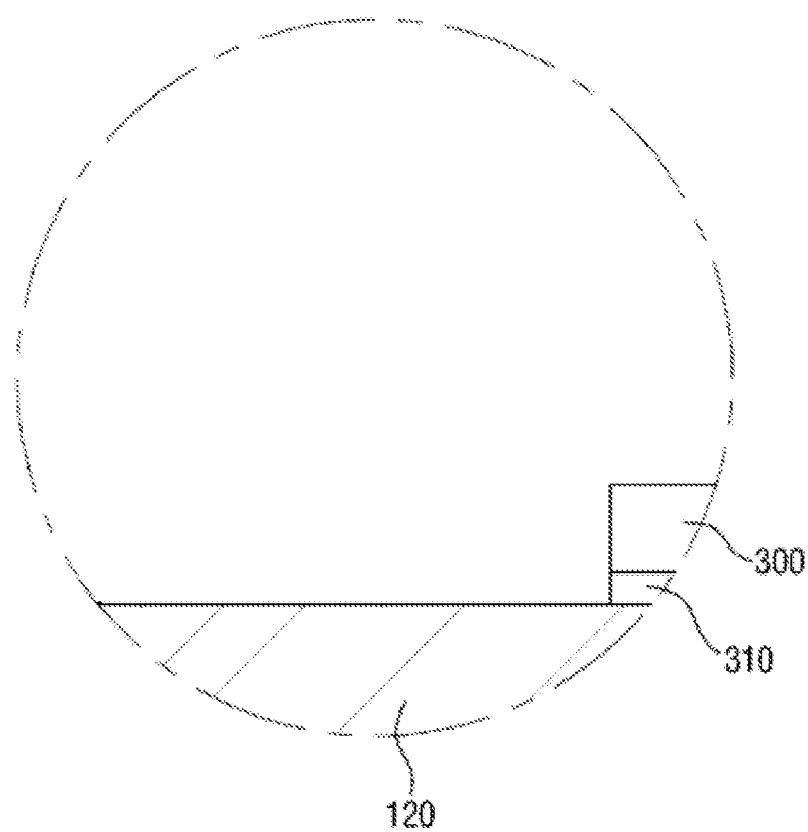
FIG. 3B is an enlarged view of portion B of FIG. 2, according to one or more exemplary embodiments.

FIG. 1 is a plan view schematically illustrating a display device, according to one or more exemplary embodiments. FIG. 2 is a cross-sectional view schematically illustrating the display device of FIG. 1, FIG. 3A is an enlarged view of portion A of FIG. 2, and FIG. 3B is an enlarged view of portion B of FIG. 2.

Referring to FIGS. 1, 2, 3A, and 3B, a display device may include a panel substrate 100, a touch sensing layer 200, a first printed circuit board 300, a first driver integrated circuit (IC) 400, a second printed circuit board 500, and a second driver IC 600.

The panel substrate 100 may include a first substrate 110 and a second substrate 120. The panel substrate 100 may further include a pixel unit (not illustrated) in which a plurality of pixels is arranged. For instance, the plurality of pixels may be are formed in a position where a plurality of scan lines (not illustrated) and a plurality of data lines (not illustrated) are arranged in a matrix formation between the first substrate 110 and the second substrate 120. Each of the pixels may include switching devices, for example, thin film transistors, that may be turned on/off according to a control signal applied from a printed circuit board, such as an external printed circuit board (not illustrated), as well as include a light emitting element that emits light under the control of the switching devices. An area that corresponds to the position where the pixel unit is formed may be a display area DA configured to display an image.

The first substrate 110 may be made of any suitable material, such as an inorganic material (e.g., glass), a metal material, an organic material (e.g., resin), etc. The pixel unit may be formed on an upper portion of the first substrate 110. Wires (e.g., metal wires) and pads may be arranged on the first substrate 110. The wires and pads may be connected to the scan lines and the data lines of the pixel unit to transfer signals.

The second substrate 120 may be positioned on the first substrate 110 with the pixel unit disposed therebetween. The second substrate 120 may be made of any suitable material, such as the aforementioned materials utilized to form the first substrate 110. The second substrate 120 may be smaller than the first substrate 110. In this manner, the second substrate 120 may expose the wires and/or pads formed on the first substrate 110, as will become more apparent below.

The touch sensing layer 200 may be positioned on the second substrate 120. The touch sensing layer 200 may include a plurality of sensing patterns (not illustrated) and sensing lines (not shown) connected to the sensing patterns. An area where the sensing patterns are formed may correspond to the display area DA, and an area where the sensing lines are formed may be a non-display area disposed outside the display area DA. The touch sensing layer 200 may be an electrostatic capacitance type touch sensing layer; however, any other suitable touch sensing layer may be utilized in association with exemplary embodiments described herein. If the touch sensing layer 200 is touched (or almost touched) by a contact object, such as a user's hand or a stylus pen, the touch sensing layer 200 enables sensing signals sensed by the sensing patterns to be transferred to the second driver IC 600 through the first printed circuit board 300 and the first driver IC 400.

According to one or more exemplary embodiments, one end of the first printed circuit board 300 may be connected to an end portion of the second substrate 120, and the other end of the first printed circuit board 300 may be connected to the first driver IC 400. In this manner, the first printed circuit board 300 and the first driver IC 400 come in contact with the second substrate 120 and the first substrate 110, respectively. In other words, the first printed circuit board 300 and the first driver IC 400 are formed on different layers, and a part of the first printed circuit board 300 may be arranged on the first driver IC 400 to partially overlap the first driver IC 400. The first printed circuit board 300 and the first driver IC 400 may be electrically connected through the first pad 410. The first printed circuit board 300 may be attached to the end portion of the second substrate 120 by an anisotropic conductive film (ACF) 310, such as illustrated in FIG. 3B. An area where the first printed circuit board 300 is attached to the end portion of the second substrate 120 may be a pad area (not illustrated) where the second substrate 120, which receives input signals transferred through the wires of the touch sensing layer 200, is formed. When the first printed circuit board 300 is attached to the second substrate 120, a process may be performed at a relatively low temperature. In other words, the ACF 310 is configured to allow for relatively low temperature, for example, a temperature of 80° C. to 150° C., bonding conditions. As such, the ACF 310 enables the prevention (or at least reduction) in heat damage to the first driver IC 400 that is generated from the first printed circuit board 300 since the other end of the first printed circuit board 300 is connected to the first driver IC 400. The first printed circuit board 300 may transfer the sensing signals sensed by the touch sensing layer 200 to the first driver IC 400. Since the first printed circuit board 300 is electrically connected to the first driver IC 400, the size of the first printed circuit board 300 can be reduced. The first printed circuit board 300 may be a flexible printed circuit board (FPCB)

The first driver IC 400 may transfer the sensing signals of the touch sensing layer 200 that are input from the first printed circuit board 300 to the second printed circuit board 500. Further, the first driver IC 400 may receive RGB data signals and timing signals that are input from the second printed circuit board 500, and may generate and transfer pixel control signals for controlling the operation of the pixel unit to scan wires and data wires that are formed on the first substrate 110. The first driver IC 400 may be mounted in a chip-on-glass (COG) method.

Referring to FIG. 3A, the first driver IC 400 may include a first pad 410, a wafer 420, a through-electrode 430, and a second pad 440. The first pad 410 may be arranged on the first driver IC 400 to electrically connect the first printed circuit board 300 to the first driver IC 400. The first pad 410 may be a bump pad, however, any other suitable pad may be utilized in association with exemplary embodiments described herein.

The wafer 420 may be a substrate of the first driver IC 400. Electrical devices (not illustrated), such as diodes and transistors, may be arranged on the wafer 420. The through-electrode 430 may be formed by forming a hole in a position that corresponds to the first pad 410 to penetrate the first driver IC 400. An insulating layer may be formed on an inner side wall of the hole, and then the hole may be filled with a conductive material, such as, for instance, a metal material (e.g., copper (Cu)), however, any other suitable conductive materials may be utilized in association with exemplary embodiments described herein. The through-electrode 420 enable the transfer of the sensing signals sensed by the touch sensing layer 200 to the second printed circuit board 500.

The second pad 440 is arranged on the first substrate 110 to transfer the sensing signals of the touch sensing layer 200 that are transferred through the through-electrode 420 to the wires formed on the first substrate 110. One end of the second printed circuit board 500 may be connected to the end portion of the first substrate 110, and the other end of the second printed circuit board 500 may be connected to another printed circuit board, e.g., an external printed circuit board (not illustrated). The second printed circuit board 500 may be attached to the end portion of the first substrate 110 through an anisotropic conductive film (ACF) 510. The second printed circuit board 500 may be attached to the first substrate 120 at high temperature. This is because the second printed circuit board 500 is attached to the first substrate 110 to be spaced apart at a determined distance from the first driver IC 400. The second printed circuit board 500 may be a flexible printed circuit board, and may include the second driver IC 600.

The second driver IC 600 can be arranged in any suitable place, e.g., at or near an edge of the second printed circuit board 500. The second driver IC 600 may receive the sensing signals of the touch sensing layer 200 through the second printed circuit board 500. The second driver IC may be configured to determine the contact position through calculating the change of capacitance of the sensing signals.

Figure 4:
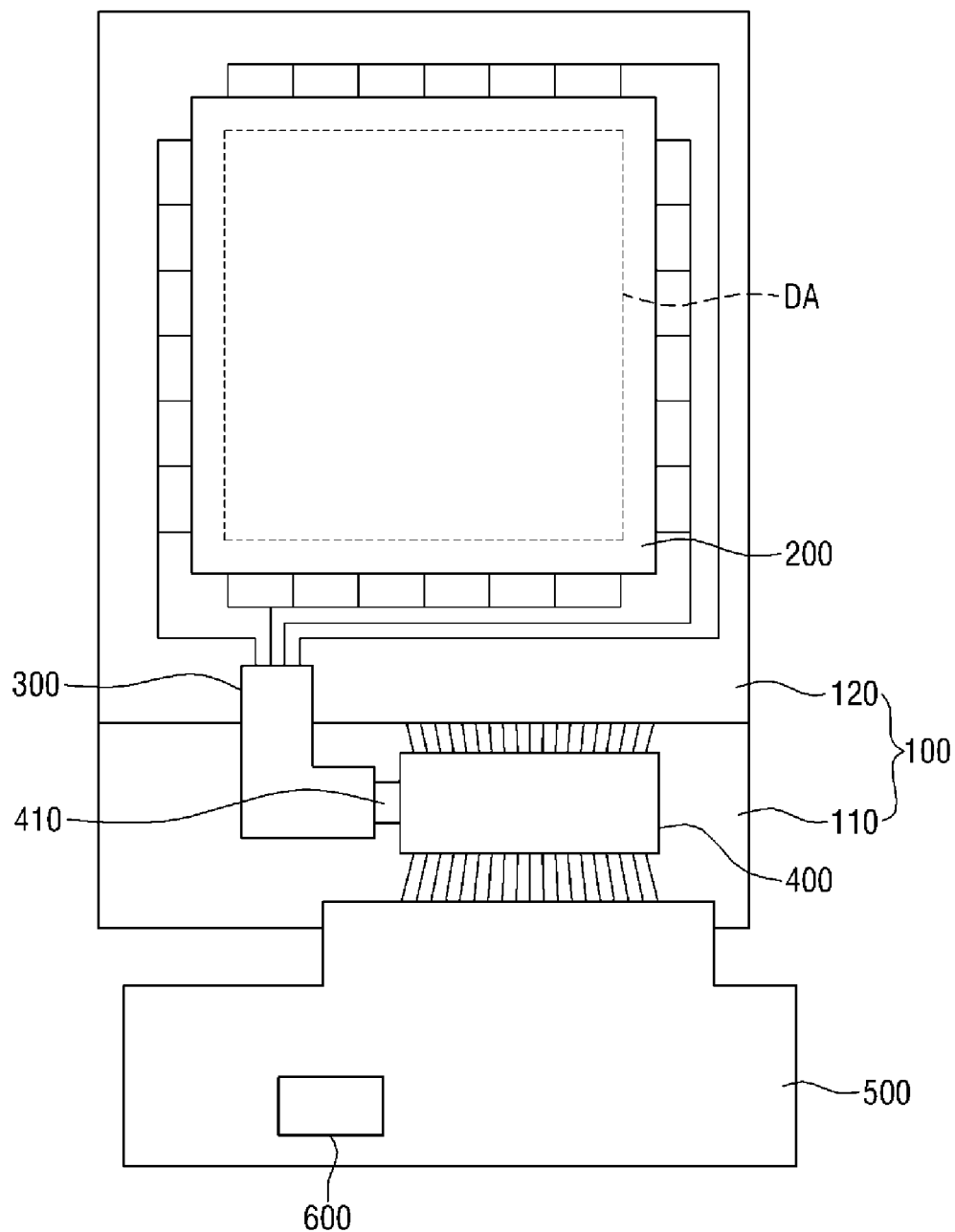
FIG. 4 is a plan view schematically illustrating a display device, according to one or more exemplary embodiments.
Figure 5:
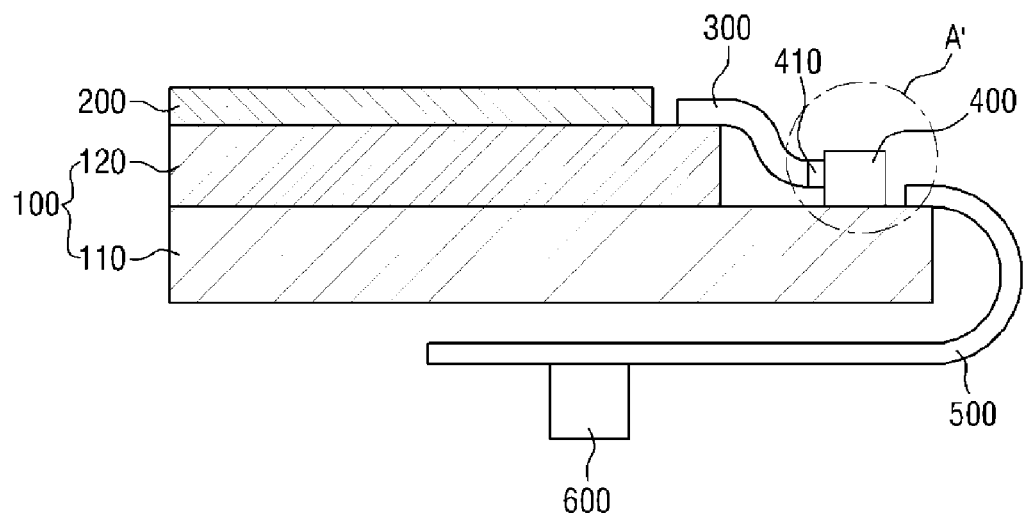
FIG. 5 is a cross-sectional view schematically illustrating the display device of FIG. 4, according to one or more exemplary embodiments.

FIG. 4 is a plan view schematically illustrating a display device, according to one or more exemplary embodiments. FIG. 5 is a cross-sectional view schematically illustrating the display device of FIG. 4, and FIG. 6 is an enlarged view of portion A' of FIG. 5.

Figure 6:
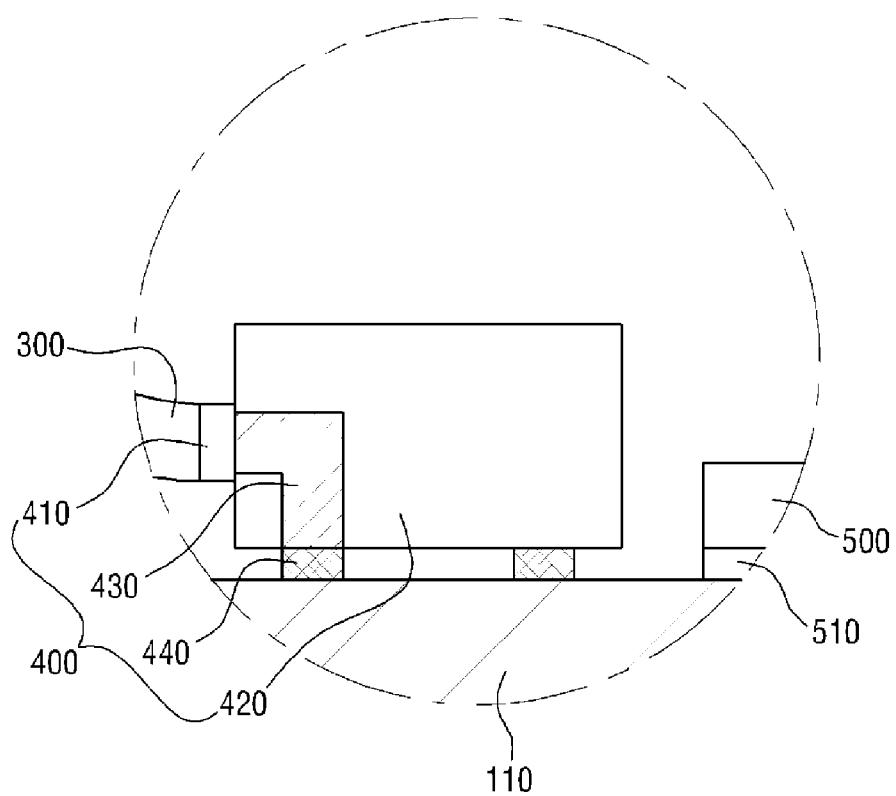
FIG. 6 is an enlarged view of portion A' of FIG. 5, according to one or more exemplary embodiments.

The structure illustrated in FIGS. 4-6 is similar to the structure as described above with reference to FIGS. 1-3; however, the connection relationships between the first printed circuit board 300 and the first driver IC 400 differ. As such, explanation of the duplicate constituent elements and configurations, such as the panel substrate 100, the touch sensing layer 200, the second printed circuit board 500, and the second driver IC 600, will be omitted to avoid obscuring exemplary embodiments described herein.

Referring to FIGS. 4 to 6, one end of the first printed circuit board 300 may be connected to an end portion of the second substrate 120, and the other end of the first printed circuit board 300 may be connected to the first driver IC 400. For instance, the first printed circuit board 300 may be electrically connected to one side portion of the first driver IC 400 through the first pad 410, which may be disposed on a lateral surface of the wafer 420. The first printed circuit board 300 may be attached to the end portion of the second substrate 120 by an anisotropic conductive film (ACF). An area where the first printed circuit board 300 is attached to the end portion of the second substrate 120 may be a pad area where the second substrate 120 that receives an input of signals transferred through the wires of the touch sensing layer 200 is formed. When the first printed circuit board 300 is attached to the second substrate 120, a process may be performed at a relatively low temperature. This is to prevent (or otherwise reduce) the first driver IC 400 from being damaged by heat that is generated from the first printed circuit board 300 since the other end of the first printed circuit board 300 is connected to the first driver IC 400. The first printed circuit board 300 may transfer the sensing signals sensed by the touch sensing layer 200 to the first driver IC 400. Since the first printed circuit board 300 is electrically connected to the first driver IC 400, the size of the first printed circuit board 300 may be reduced. The first printed circuit board 300 may be a flexible printed circuit board (FPCB).

The first driver IC 400 may transfer the sensing signals of the touch sensing layer 200, which are input from the first printed circuit board 300, to the second printed circuit board 500. Further, the first driver IC 400 may receive RGB data signals and timing signals that are input from the second printed circuit board 500, and may generate and transfer pixel control signals for controlling the operation of the pixel unit to scan wires and data wires that are formed on the first substrate 110. The first driver IC 400 may be mounted in a chip-on-glass (COG) method.

Referring to FIG. 6, the first driver IC 400 may include a first pad 410, a wafer 420, a through-electrode 430, and a second pad 440. The first pad 410 may be arranged on a side (or lateral) surface of the first driver IC 400 to electrically connect the first printed circuit board 300 to the first driver IC 400. The first pad 410 may be a bump pad, however, any other suitable pad may be utilized in association with exemplary embodiments described herein. The wafer 420 may be a substrate of the first driver IC 400. Although not illustrated, electrical devices, such as diodes and transistors, may be arranged on the wafer 420.

The through-electrode 430 may be formed in a backward "r," e.g., "⊓" shape in a position that corresponds to the first pad 410. This is because the first pad 410, which may be a signal transmitting or receiving unit, is attached to the side surface of the first driver IC 400, and the second pad 440 that transmits or receives signals with the first pad 410 is formed on the lower surface of the first driver IC 400. The through-electrode 430 may be formed by forming a hole that penetrates from the side surface of the first driver IC 400 to the lower surface on which the second pad 440 is formed, forming an insulating layer on an inner side wall of the hole, and then filling the hole with a conductive material, such as a metal material (e.g., copper (Cu)). For instance, a first hole may be formed in a side surface of the wafer 420 and a second hole may be formed in a lower surface of the wafer 420. In this manner, the first hole and the second hole may intersect one another formed the above-noted backwards "r" shape. The second pad 440 is arranged on the first substrate 110 to transfer the sensing signals of the touch sensing layer 200 transferred through the through-electrode 430 to the wires formed on the first substrate 110.

Figure 7:
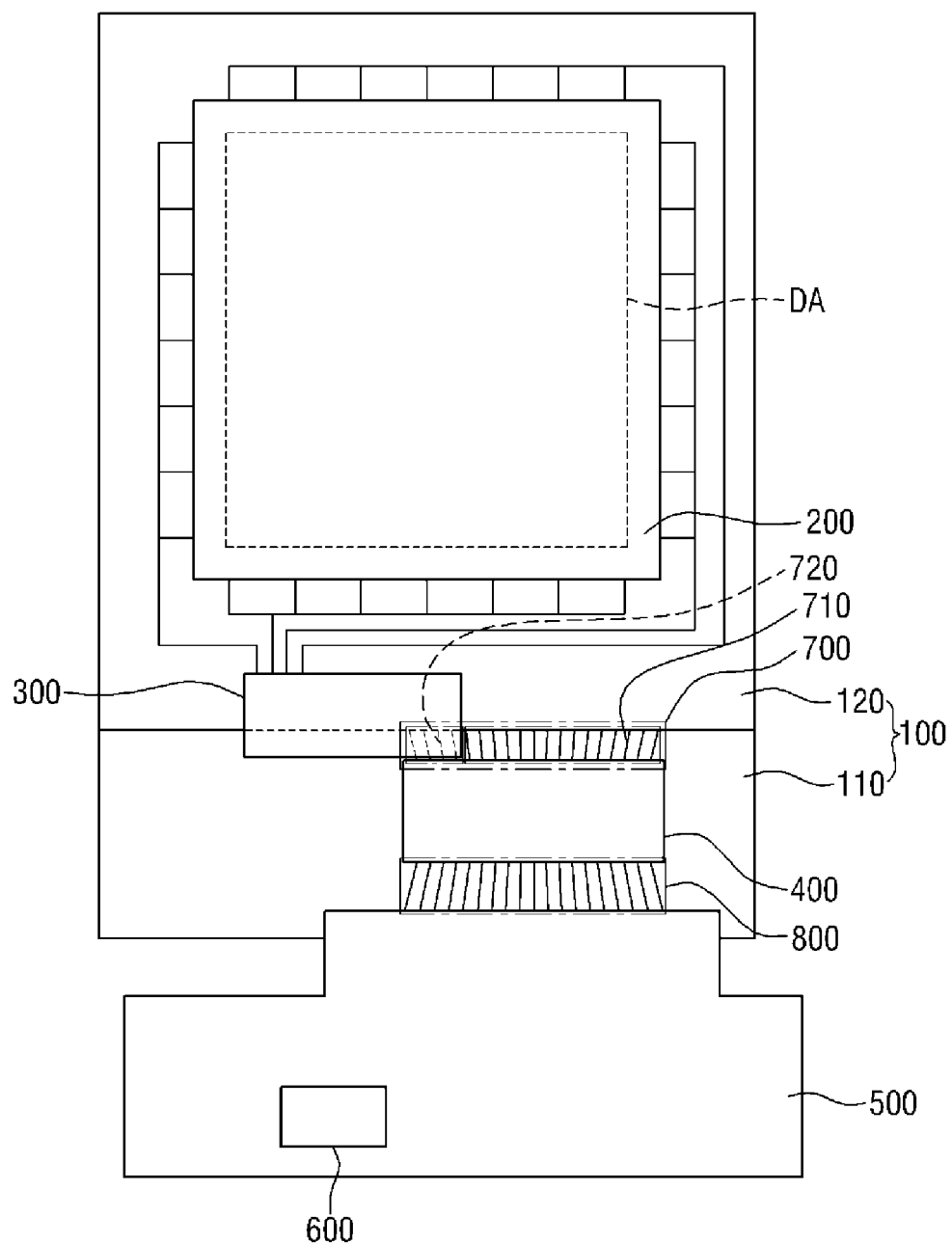
FIG. 7 is a plan view schematically illustrating a display device, according to one or more exemplary embodiments.
Figure 8:
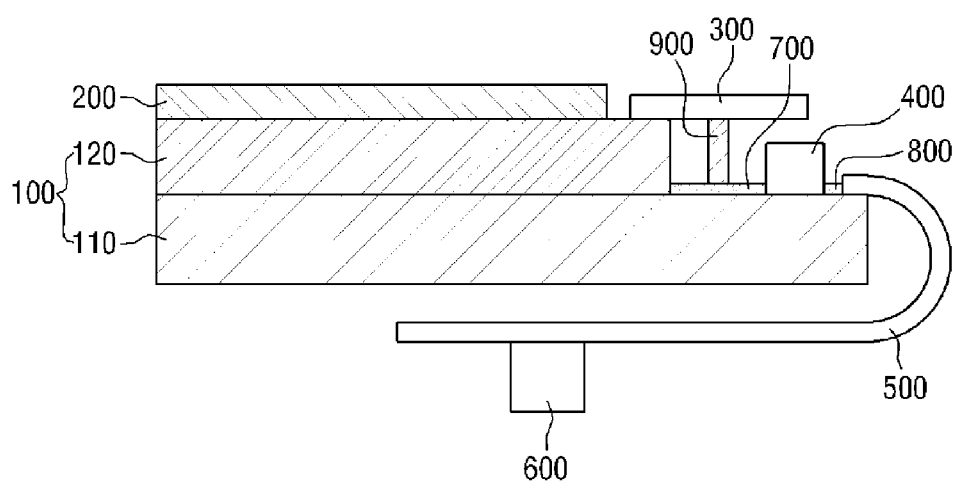
FIG. 8 is a cross-sectional view schematically illustrating the display device of FIG. 7, according to one or more exemplary embodiments.

FIG. 7 is a plan view schematically illustrating a display device, according to one or more exemplary embodiments. FIG. 8 is a cross-sectional view schematically illustrating the display device of FIG. 7.

Referring to FIGS. 7 and 8, a display device may include a panel substrate 100, a touch sensing layer 200, a first printed circuit board 300, a first driver IC 400, a second printed circuit board 500, a second driver IC 600, a first wire area 700 (e.g., a first metal wire area), and a second wire area 800 (e.g., a second metal wire area). The structure illustrated in FIGS. 7 and 8 is similar to the structure described above with reference to FIGS. 1-3; however, the configurations that are electrically connected to the first printed circuit board 300 differ. As such, explanation of the duplicate constituent elements and features thereof, such as the second substrate 120 of the panel substrate 100, the touch sensing layer 200, the second printed circuit board 500, and the second driver IC 600, will be omitted to avoid obscuring exemplary embodiments described herein.

According to one or more exemplary embodiments, the panel substrate 100 may include a first substrate 110 and a second substrate 120. The first substrate 110 may be made of any suitable material, e.g., an inorganic material (such as glass), a metal material, an organic material (such as resin), etc. The pixel unit may be formed on an upper portion of the first substrate 110. On the first substrate 110, a first metal wire area 700 for electrically connecting the pixel unit to the first driver IC 400 and the second metal wire area 800 for electrically connecting the first driver IC 400 to the second printed circuit board 500 may be provided.

The first metal wire area 700 may include a plurality of metal wires 710 and dummy wires 720 that are electrically connected to the pixel unit. The second metal wire area 800 may include a plurality of metal wires and dummy wires that are electrically connected to the second printed circuit board 500. Although described as "metal" wires, the wires may be formed of any suitable conductive material, as well as may be referred to generally as signal transmission lines.

According to one or more exemplary embodiments, one end of the first printed circuit board 300 may be connected to an end portion of the second substrate 120, and the other end of the first printed circuit board 300 may be connected to the first metal wire area 700. For instance, the first printed circuit board 300 may be electrically connected to the dummy wires 720 of the first metal wire area 700 through a conductive member 900. The conductive member 900 may be made of any suitable conductive material, such as a metal material, and may be included in a sealant for forming the display device.

The first printed circuit board 300 may be attached to the end portion of the second substrate 120 by an anisotropic conductive film (ACF). An area where the first printed circuit board 300 is attached to the end portion of the second substrate 120 may be a pad area where the second substrate 120, which receives input of signals transferred through the wires of the touch sensing layer 200, is formed. When the first printed circuit board 300 is attached to the second substrate 120, a process may be performed at a relatively low temperature. This is to prevent (or otherwise reduce) the first driver IC 400 from being damaged by heat that is generated from the first printed circuit board 300 since the first printed circuit board 300 is arranged adjacent to the first driver IC 400. The first printed circuit board 300 may transfer the sensing signals sensed by the touch sensing layer 200 to the first driver IC 400 through the dummy wires 720 of the first metal wire area 700. Since the first printed circuit board 300 is electrically connected to the first metal wire area 700, the size of the first printed circuit board 300 may be reduced. The first printed circuit board 300 may be a flexible printed circuit board (FPCB).

The first driver IC 400 may transfer the sensing signals of the touch sensing layer 200 that are input through the first metal wire area 700 to the second printed circuit board 500 through the second metal wire area 800. In this manner, the sensing signals that are transferred to the second printed circuit board 500 through the first driver IC 400, may be transferred to the second printed circuit board 500 on which a through-electrode (not shown) that penetrates the first driver IC 400 is formed, or may be transferred to the second printed circuit board 500 through a plurality of metal wires of the second metal wire area 800 according to the control signal of the first driver IC 400. Further, the first driver IC 400 may receive RGB data signals and timing signals that are input from the second printed circuit board 500, and may generate and transfer pixel control signals for controlling the operation of the pixel unit to scan wires and data wires that are formed on the first substrate 110. The first driver IC 400 may be mounted in a chip-on-glass (COG) method.

Figure 9:
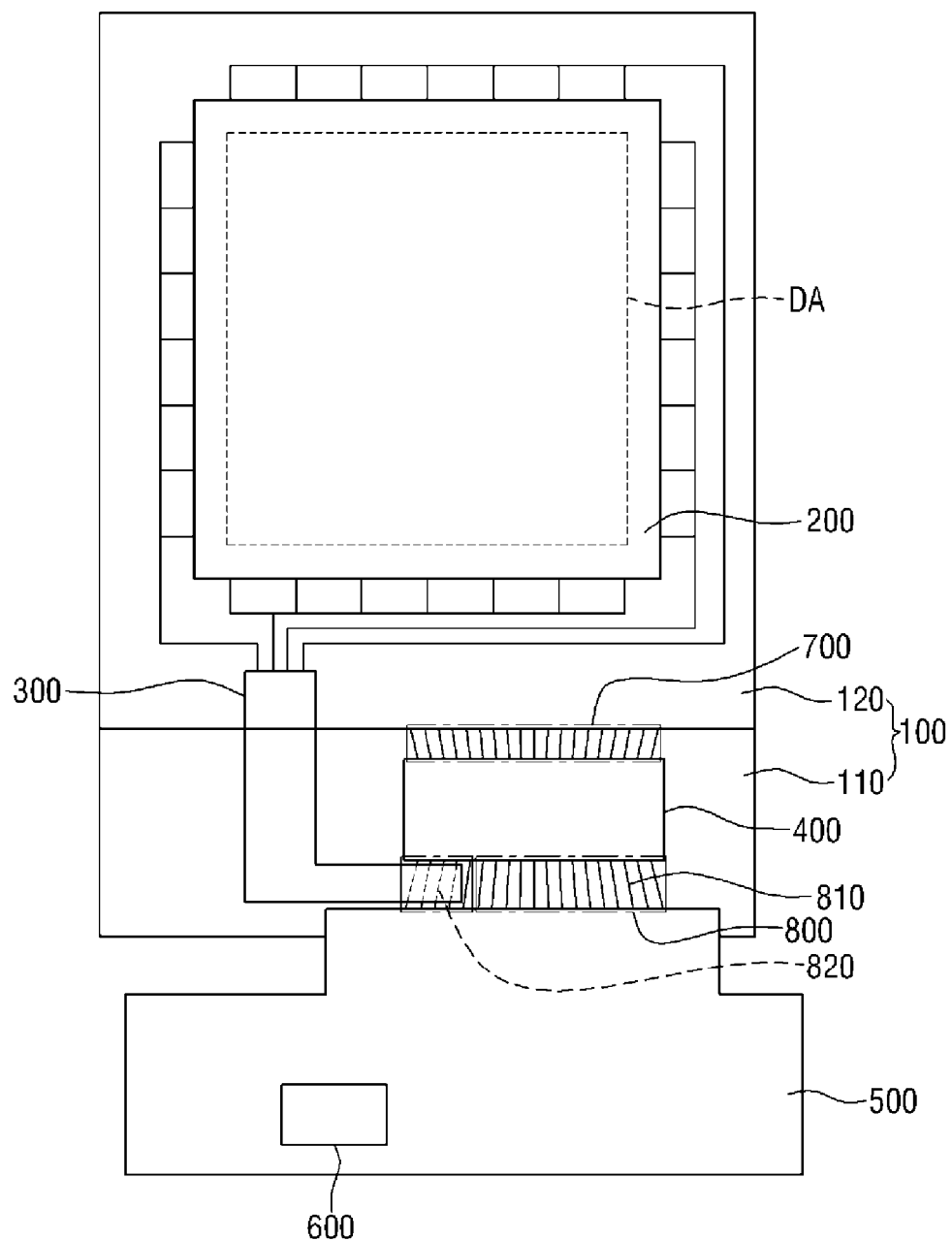
FIG. 9 is a plan view schematically illustrating a display device, according to one or more exemplary embodiments.
Figure 10:
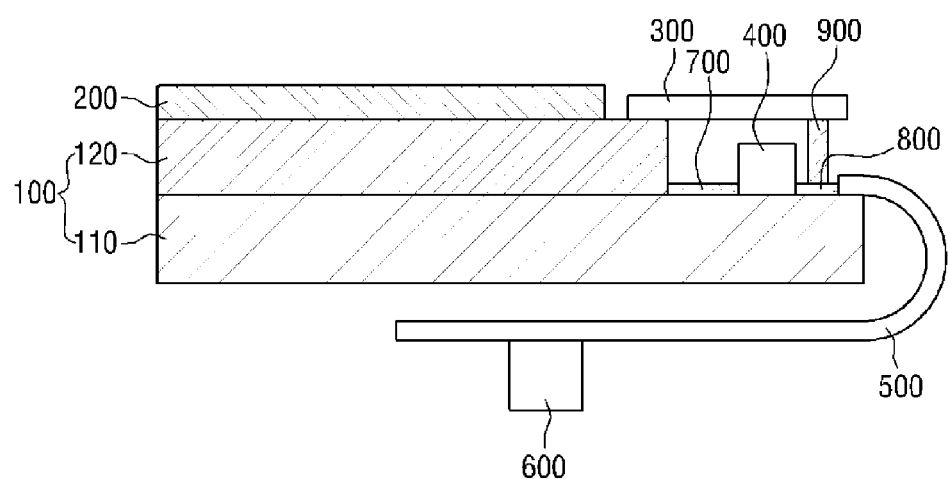
FIG. 10 is a cross-sectional view schematically illustrating the display device of FIG. 9, according to one or more exemplary embodiments.

FIG. 9 is a plan view schematically illustrating a display device, according to one or more exemplary embodiments. FIG. 10 is a cross-sectional view schematically illustrating the display device of FIG. 9.

Referring to FIGS. 9 and 10, a display device may include a panel substrate 100, a touch sensing layer 200, a first printed circuit board 300, a first driver IC 400, a second printed circuit board 500, a second driver IC 600, a first metal wire area 700, and a second metal wire area 800. The structure illustrated in FIGS. 9 and 10 is similar to the structure as described with reference to FIGS. 1-3, 7 and 8, but the configurations that are electrically connected to the first printed circuit board 300 differ. As such, explanation of the duplicate constituent elements, such as the second substrate 120 of the panel substrate 100, the touch sensing layer 200, the second printed circuit board 500, and the second driver IC 600, will be omitted to avoid obscuring exemplary embodiments described herein.

The panel substrate 100 may include a first substrate 110 and a second substrate 120. The first substrate 110 may be made of any suitable material, e.g., an inorganic material (such as glass), a metal material, an organic material (such as resin), etc. The pixel unit may be formed on an upper portion of the first substrate 110. The first metal wire area 700 for electrically connecting the pixel unit to the first driver IC 400 and the second metal wire area 800 for electrically connecting the first driver IC 400 to the second printed circuit board 500 may be provided on the first substrate 110.

The first metal wire area 700 may include a plurality of metal wires that are electrically connected to the pixel unit. The second metal wire area 800 may include a plurality of metal wires 810 and dummy wires 820 that are electrically connected to the second printed circuit board 500. Although described as "metal" wires, the wires may be formed of any suitable conductive material, as well as may be referred to generally as signal transmission lines.

According to one or more exemplary embodiments, one end of the first printed circuit board 300 may be connected to an end portion of the second substrate 120, and the other end of the first printed circuit board 300 may be connected to the first metal wire area 700. For instance, the first printed circuit board 300 may be electrically connected to the dummy wires 820 of the second metal wire area 800 through a conductive member 900. The conductive member 900 may be made of any suitable conductive material, e.g., a metal material, and may be included in a sealant for forming the display device.

The first printed circuit board 300 may be attached to the end portion of the second substrate 120 by an anisotropic conductive film (ACF). An area where the first printed circuit board 300 is attached to the end portion of the second substrate 120 may be a pad area where the second substrate 120, which receives input signals transferred through the wires of the touch sensing layer 200, is formed. When the first printed circuit board 300 is attached to the second substrate 120, a process may be performed at a relatively low temperature. This is to prevent the first driver IC 400 from being damaged by heat that is generated from the first printed circuit board 300 since the first printed circuit board 300 is arranged adjacent to the first driver IC 400. The first printed circuit board 300 may transfer the sensing signals sensed by the touch sensing layer 200 to the second printed circuit board 500 through the dummy wires 820 of the second metal wire area 800. Since the first printed circuit board 300 is electrically connected to the second metal wire area 800, the size of the first printed circuit board 300 may be reduced. The first printed circuit board 300 may be a flexible printed circuit board (FPCB).

The first driver IC 400 may receive RGB data signals and timing signals that are input from the second printed circuit board 500, and may generate and transfer pixel control signals for controlling the operation of the pixel unit to scan wires and data wires that are formed on the first substrate 110. The first driver IC 400 may be mounted in a chip-on-glass (COG) method.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
a panel substrate comprising a first substrate and a second substrate;
a first printed circuit board disposed on the second substrate;
a driver integrated circuit (IC) disposed on the first substrate, the driver IC being electrically connected to the first printed circuit board; and
a second printed circuit board disposed on the first substrate, the second printed circuit board being electrically connected to the driver IC,
wherein:
the first substrate comprises a pixel unit, the pixel unit comprising pixels;
the driver IC comprises a first pad and a second pad;
the first pad is disposed on an upper surface or a lateral surface of the driver IC, the first pad being configured to transmit signals received via the first printed circuit board; and
the second pad is disposed on a lower surface of the driver IC, the second pad being configured to receive the signals from the first printed circuit board and to transmit the signals to the second printed circuit board.

2. The display device of claim 1, wherein:
the driver IC further comprises a through-electrode penetrating an inner portion of the driver IC; and
the through-electrode is configured to electrically connect the first pad and the second pad to one another.

3. The display device of claim 1, wherein the first printed circuit board overlaps a portion of the driver IC.

4. The display device of claim 1, further comprising:
an anisotropic conductive film,
wherein the anisotropic conductive film couples the first printed circuit board to the second substrate.

5. The display device of claim 4, wherein the anisotropic conductive film is configured to couple the second substrate and the first printed circuit board to one another in a relatively low temperature environment.

6. The display device of claim 1, further comprising:
a touch sensing layer disposed on the second substrate.

7. The display device of claim 6, wherein the first printed circuit board is electrically connected to the touch sensing layer.

8. The display device of claim 1, wherein the first printed circuit board and the second printed circuit board are flexible printed circuit boards.

* * * * *